(12) United States Patent
Miyajima

(10) Patent No.: US 6,853,091 B2
(45) Date of Patent: Feb. 8, 2005

(54) PRINTED CIRCUIT BOARD AND SOLDERING STRUCTURE FOR ELECTRONIC PARTS THERETO

(75) Inventor: Yoshiyuki Miyajima, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 9 days.

(21) Appl. No.: 10/627,710

(22) Filed: Jul. 28, 2003

(65) Prior Publication Data

US 2004/0020972 A1 Feb. 5, 2004

(30) Foreign Application Priority Data

Jul. 30, 2002 (JP) ...................................... 2002-221131

(51) Int. Cl.[7] .............................................. H01K 23/48
(52) U.S. Cl. ........................ 257/786; 257/774; 257/779
(58) Field of Search ................................ 257/786, 774, 257/779, 780

(56) References Cited

U.S. PATENT DOCUMENTS 3,610,811 A * 10/1971 O'Keefe ..................... 174/262
6,174,562 B1 * 1/2001 Bergstedt ..................... 427/97
6,201,305 B1 * 3/2001 Darveaux et al. ........... 257/779
2002/0086144 A1 * 7/2002 Honda et al. ............... 428/209

FOREIGN PATENT DOCUMENTS

| JP | 6-164119 | 6/1994 |
|----|----------|--------|
| JP | 8-340172 | 12/1996 |
| JP | 2000-091737 | 3/2000 |

* cited by examiner

Primary Examiner—Cathy F. Lam
(74) Attorney, Agent, or Firm—Wenderoth, Lind & Ponack, L.L.P.

(57) ABSTRACT

A printed circuit board having circuit patterns printed thereon has a plurality of composite lands each including a first land having a terminal hole formed at its center for inserting the terminal of a selected electric or electronic part or device, and a plurality of second lands each being contiguous to and extending outwards from the first land. The areas contiguous to the contours of the first and second lands have no conductive foils, such as copper foils, thereon such that the substrate surface of the printed circuit board is exposed in these areas. The exposed areas are effective to confine the thermal energy in the limited areas for soldering. And the composite land shape defines a ridged cone-like solder lump, which can fixedly grip the terminal of the part or device.

7 Claims, 6 Drawing Sheets

US 6,853,091 B2

PRINTED CIRCUIT BOARD AND SOLDERING STRUCTURE FOR ELECTRONIC PARTS THERETO

BACKGROUND OF THE INVENTION

1. Field of the Invention

The present invention relates to a printed circuit board having electric or electronic parts soldered to its circuit patterns.

2. Related Art

Electric or electronic apparatuses use printed circuit boards, which have a variety of electric or electronic parts soldered to their circuit patterns. Specifically such circuit patterns are formed by labyrinth-like copper foils and the like, each having electric or electronic parts soldered to lands with their terminals inserted in the terminal holes, which are made in the lands.

FIG. 5(a) is a plan view of a land 51 whereas FIG. 5(b) is a sectional view of a land 51, showing a terminal 54 of a selected electric or electronic part soldered to the land 51. The land 51 is formed on the rear side (the upper side in FIG. 5(b)) of a substrate 50, and the land 51 has a terminal hole 52 formed at its center. The land 51 is surrounded by a resist layer 53 of an insulating synthetic resin to prevent solder from attaching to the surrounding area. The terminal 54 of the electric or electronic part is joined to the land 51 by solder.

As seen from FIG. 5(b), a solder lump 55 adhered both to the land 51 and terminal 54 looks like a cone. Its inclined sides are dented, and it is small in volume or quantity compared with a hemisphere. Accordingly the cone-like solder lump 55 can hardly provide a holding strength sufficient to assure that the electric or electronic part is fixedly held on the printed circuit pattern. As a matter of fact, when electric or electronic devices having such printed circuit boards are transported, some parts are shaken loose from their printed circuit patterns. Also, printed circuit boards are influenced by surrounding temperature variations or by temperature changes caused by turning printed circuits on and off, so that some parts come off from their printed circuit patterns.

Therefore, it is necessary to locate small solder lumps for applying additional quantities of solder. This, however, is tedious and time-consuming work. Small solder lumps are easily overlooked. Also, it may be possible that an additional quantity of solder will cause short-circuiting.

In the hope of increasing the solder lump quantity on each land JP 2000-91737(A), titled "Printed Circuit Boards and Their Manufacturing Method" (see FIGS. 6(a) and 6(b)), has proposed use of a land comprising a center circular land and a plurality of second sector lands surrounding the first center land. The printed circuit board has electronic parts or devices borne with their terminals inserted in the terminal holes of the circular lands. Such a printed circuit board is moved to sweep on the melted solder bath, solder lumps separately built on the circular and sector lands, and then these solder lumps are joined together under the influence of surface tension to provide a large solder lump quantity.

FIG. 6(a) is a plan view of one example of such composite land whereas FIG. 6(b) is a cross section of the composite land taken along the line 6(b)—6(b) in FIG. 6(a). As shown, a center circular land 56 has a terminal hole 52 formed at its center, and four sector lands 57 surround the first center land 56. A resist layer 58 of an insulating synthetic resin is laid on the copper foil surface, filling the inter-land zones.

Printed circuit boards each having circuit patterns printed on their opposite surfaces are often used. These circuit patterns are locally connected via copper foils (conductor linings) applied to the inner surfaces of the terminal holes. With this arrangement heat can be transferred from the front to the rear circuit patterns via the conductor linings of the terminal holes when terminals of selected parts and devices are being soldered to one of the front and rear circuit patterns. Thus, the thermal quantity available for soldering will be lower than that for soldering in a printed circuit board having a circuit pattern on one surface. Division of the land into separate sections proposed in JP2000-91737(A) is not so effective in confining the thermal energy to the limited area for soldering, and hence, in increasing the solder quantities in joining the terminal and the land.

Further, JP8-340172(A), titled "Printed Circuit Boards" has proposed a composite land comprising a center circular land and a plurality of second radial lands projecting from the first center land. The inter-radial land spaces are filled with a resist layer of insulating synthetic resin, which is laid on the copper foil of the substrate. Therefore, thermal energy is permitted to leak from the composite land contour to the underlying copper foil of the inter-radial land space.

In view of the above, one object of the present invention is to provide a printed circuit board whose soldering structure permits an adequate quantity of solder to be used in soldering the terminal of the electric or electronic part to its circuit pattern, thus assuring that the solder lump be strong enough to fixedly hold the part or device on the circuit pattern. Also, another object of the present invention is to provide a soldering structure which permits an adequate quantity of solder to be used in soldering the terminal of the electric or electronic part or device to its circuit pattern, thus assuring that the solder lump be strong enough to fixedly hold the part or device on the circuit pattern.

SUMMARY OF THE INVENTION

To attain these objects a printed circuit board including a substrate having circuit patterns printed on first and second surfaces thereof is improved according to the present invention in that it has a plurality of composite lands each comprising a first land having a terminal hole made at its center for inserting the terminal of a selected electric or electronic part or device, and a plurality of second lands each being contiguous to and extending outwards from the first land, and that, for each of the composite lands, thermal insulating areas are provided radially outwardly of the first lands and circumferentially between adjacents ones of the second lands, the thermal insulating areas being constituted by areas of the substrate devoid of a conductive layer, such as copper foil, so as to expose the substrate surface of the printed circuit board. The exposed areas effectively prevent thermal energy from leaking outwards from the composite land when soldering an electric or electronic part or device to the composite land.

The printed circuit board may further comprise, for each of the composite lands, narrow resist layers formed so as to be arranged along between the composite land and each of the thermal insulating areas.

A soldering structure for soldering electric or electronic parts to the circuit pattern of a printed circuit board is improved according to the present invention in that a substrate has a plurality of composite lands each comprising a first land having a terminal hole made at its center for inserting the terminal of a selected electric or electronic part or device, and a plurality of second lands each being contiguous to and extending outwards from the first land, thermal insulating areas contiguous to the first and second lands being devoid of a conductive layer, such as copper foil, so to expose the substrate surface of the printed circuit board. For at least one of the composite lands, a solder lump is formed on the first land for securing the terminal of the part or device to the first land and its adjoining second lands. The solder lump is shaped into a ribbed conical form having the terminal at its center and its outer ribs integrally connected to and projecting from the cone.

The soldering structure according to the present invention has substrate-exposed zones having no thermally conductive foils contiguous to the first and second lands, thus preventing leakage of thermal energy from the first and second lands. Thus, sufficient quantities of thermal energy can be confined to the limited area to assure reliable soldering. Still advantageously, the ridged cone-like shape is useful in building up the solder lump to be sufficiently strong to assure that the terminal of the part or device is fixedly gripped; the terminal can be fixedly supported by the surrounding cone-like solder lump and ridge lumps as a whole. This soldering structure requires a minimum quantity of solder material.

Other objects and advantages of the present invention will be understood from the following description of some preferred embodiments of the present invention, which are shown in the accompanying drawings.

DETAILED DESCRIPTION OF PREFERRED EMBODIMENTS

Figure 1A:
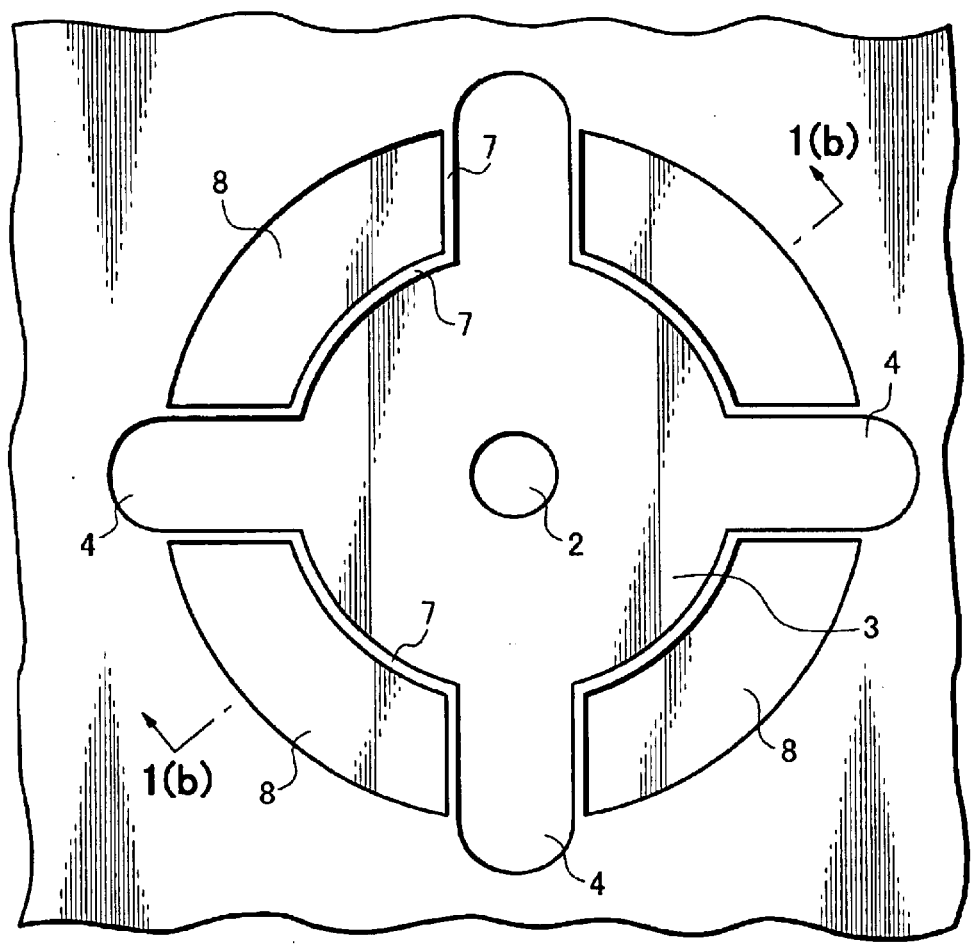
FIG. 1(a) is a plan view of a composite land according to a first embodiment of the present invention.
Figure 1B:
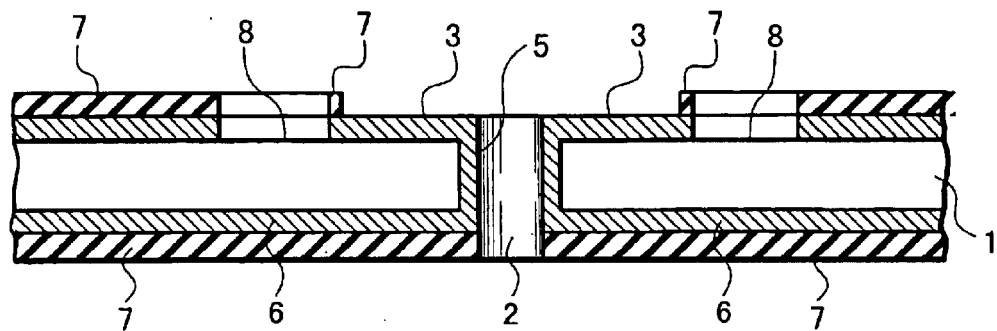
FIG. 1(b) is a sectional view of the composite land taken along the line "1(b)"—"1(b)" in FIG. 1(a)

Referring to FIGS. 1(a) and 1(b), a printed circuit board has circuit patterns printed on its substrate 1. As shown, a first circular land 3 has a through hole 2 to insert the terminal of a selected electric or electronic part or device, and four second radial lands 4 are contiguous to the first circular land 3, extending outwards therefrom. The substrate 1 has circuit patterns 6 printed on its opposite sides, and electric or electronic parts or devices are mounted and joined to the composite lands with their terminals inserted in the terminal holes 2 and soldered to the composite lands.

The composite land of copper foil is connected to the underlying circuit pattern 6 on the rear side via the conductor layer 5, which is applied to the inner circumference of the terminal hole 2, as seen from FIG. 1(b). A selected part or device is mounted on the rear side of the substrate 1 with its terminal inserted into the terminal hole 2.

As seen from FIG. 1(a), the surface of the printed circuit board is locally exposed by removing conductive foils such as copper foils from the areas 8, which are contiguous to the contours of the first and second lands 3 and 4. Also, narrow resist layers 7 are formed between the exposed areas 8 and the first and second lands 3 and 4.

When soldering the terminal of the part or device to the composite land 3, 4, the thermal energy applied to the composite land is partly allowed to leak to the underlying circuit pattern 6 via the conductor layer 5 of the terminal hole 2. To compensate for the inevitable leak of thermal energy to the underlying circuit pattern 6, the exposed areas 8 prevent thermal energy from leaking outwards from the first and second land contours on the front side of the printed circuit board.

Figure 2A:
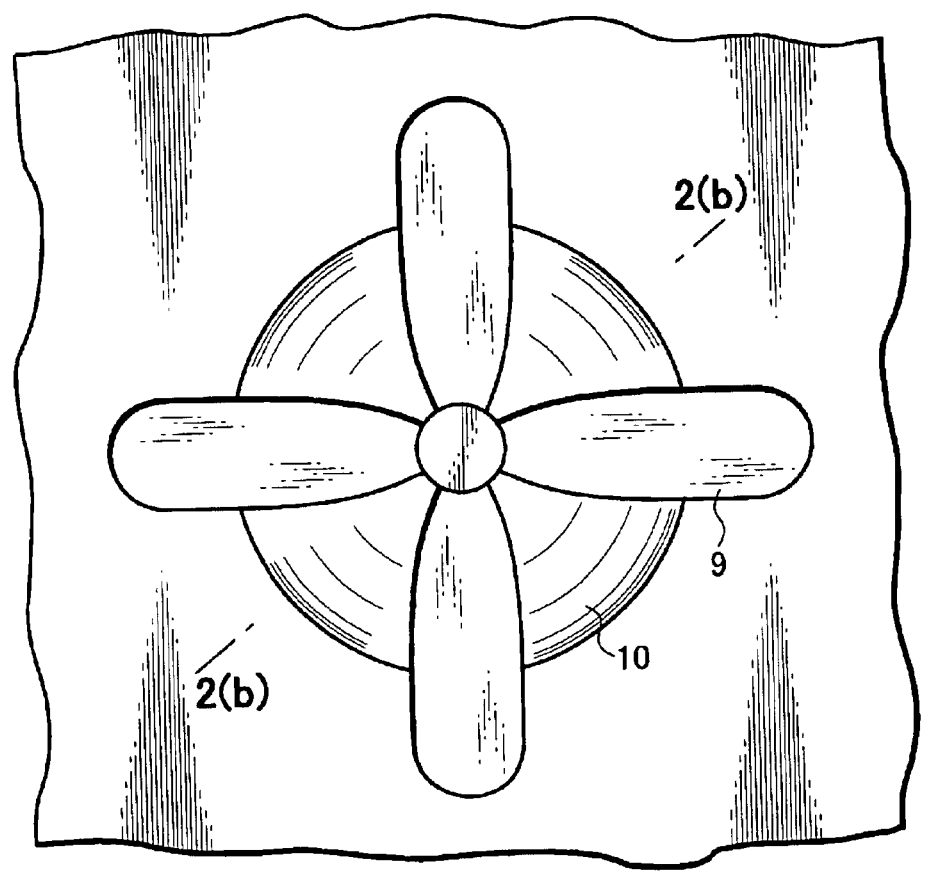
FIG. 2(a) is a plan view showing how the soldering lump is built on the composite land of FIG. 1(a)
Figure 2B:
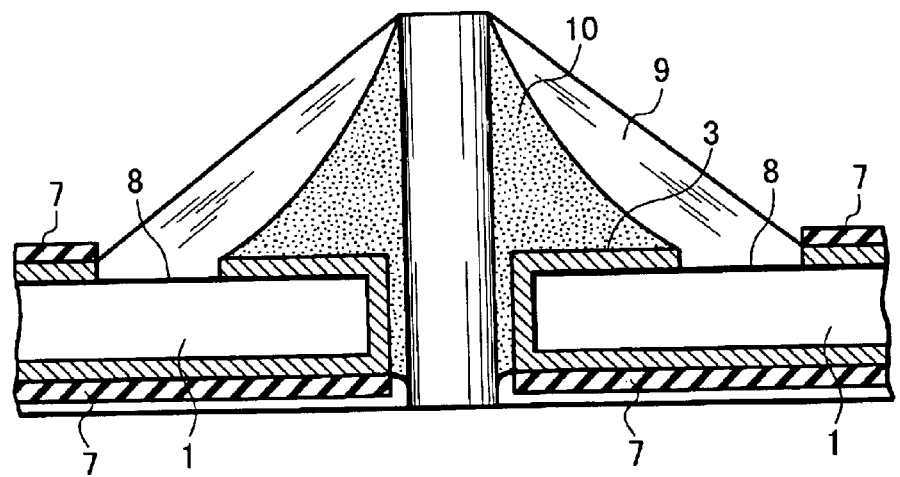
FIG. 2(b) is a sectional view taken along the line "2(b)"—"2(b)" in FIG. 2(a), showing the surrounding cone-like solder lump and ridge lumps.

Referring to FIGS. 2(a) and 2(b), the solder lump built up on the composite land is composed of a circular cone-like lump 10 and four radial ridge lumps 9. The ridged cone-like shape has the effect of significantly increasing the strength with which the terminal of the part or device is fixedly held on the circuit pattern. The ridged cone-like lump is smaller in volume than the hemispherical shape whose base is equal to the circular contour drawn by connecting the outer ends of the four radial ridges 9, and accordingly the solder material of the ridged cone-like lump is small in quantity, compared with the hemispherical lump. In spite of this, the ridged cone-like shape can provide comparable holding strength.

Figure 3:
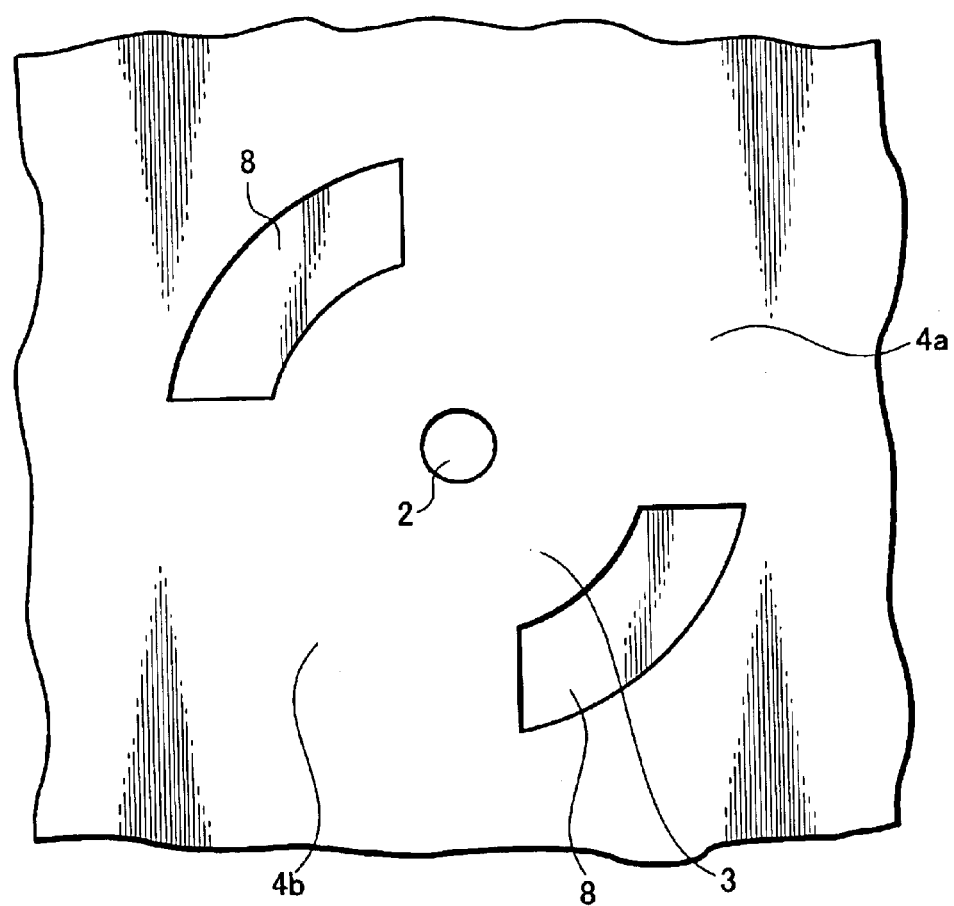
FIG. 3 is a plan view of a composite land according to a second embodiment of the present invention.

Referring to FIG. 3, another example of a composite land is composed of a first land 3 having a terminal hole 2 formed at its center, and opposite second lands 4a and 4b contiguous to the first land 3 and extending outwards therefrom. Two sectors 8 are formed by removing the underlying copper foils to expose the surface of the substrate 1.

Figure 4:
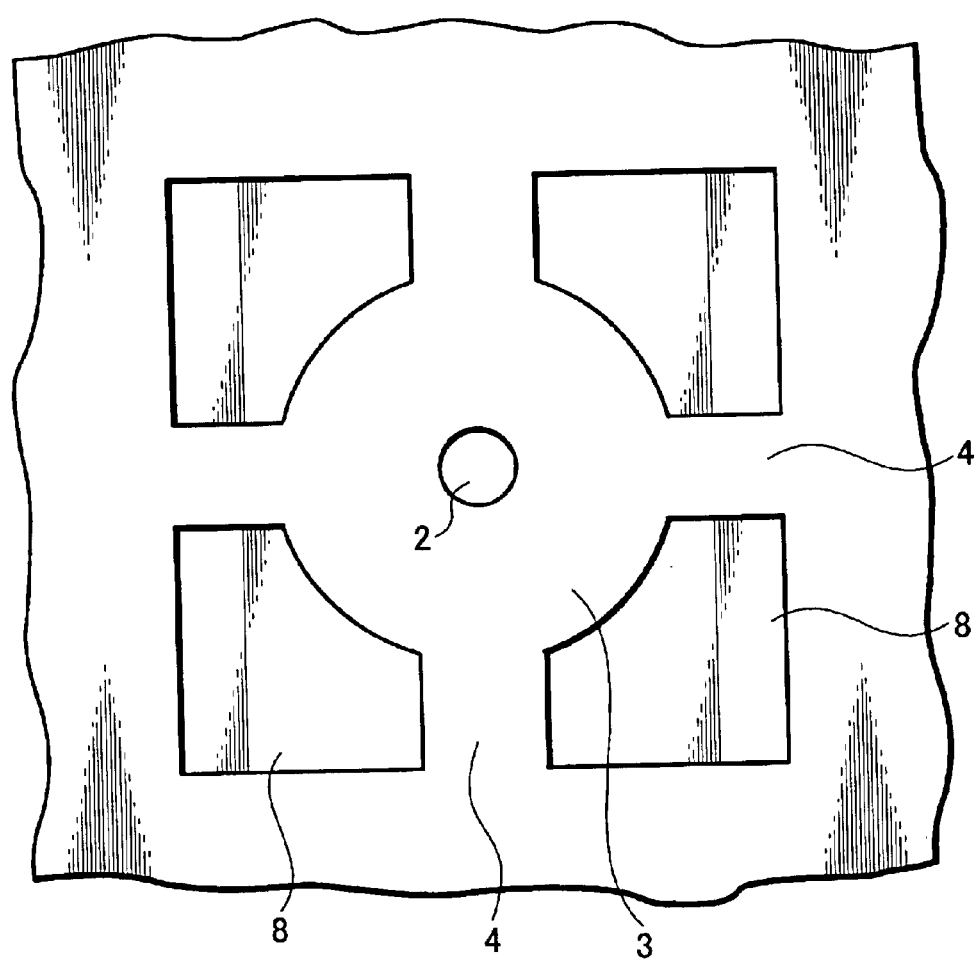
FIG. 4 is a plan view of a composite land according to a third embodiment of the present invention.
Figure 5A:
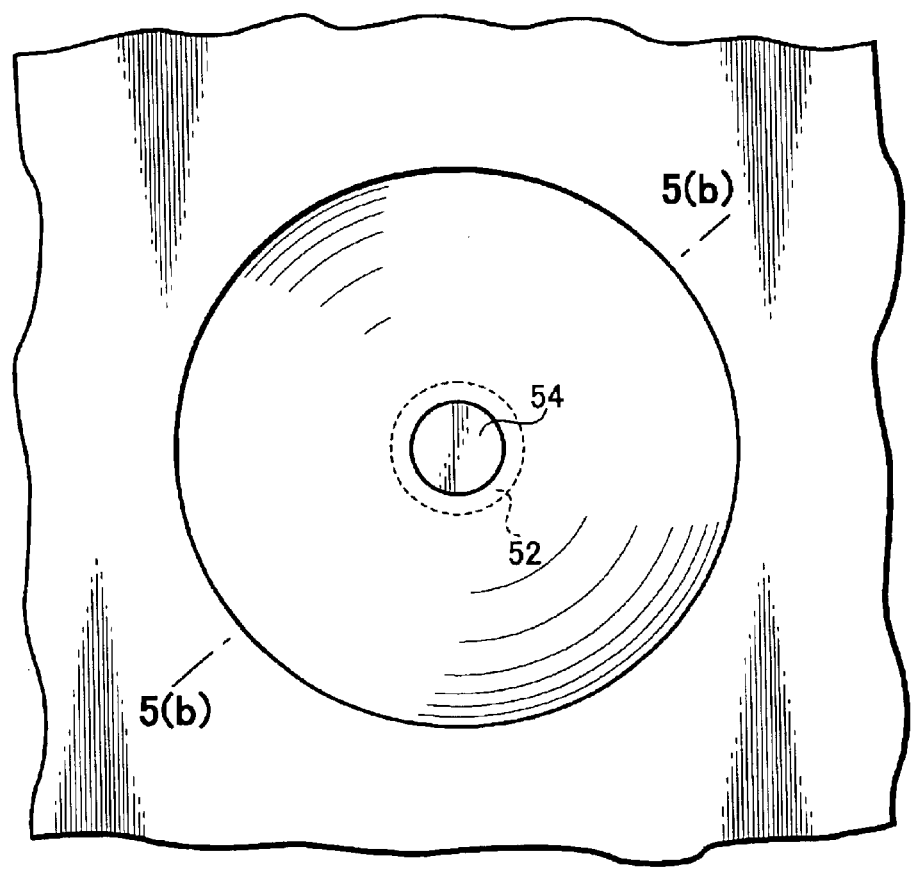
FIG. 5(a) is a plan view showing a conventional circular land.
Figure 5B:
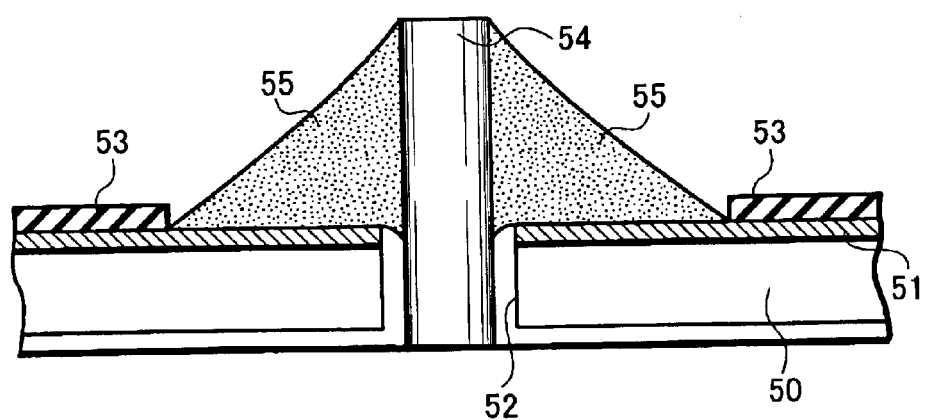
FIG. 5(b) is a sectional view of the circular land taken along the line "5(b)"—"5(b)" in FIG. 2(a), showing the cone-like solder lump.
Figure 6A:
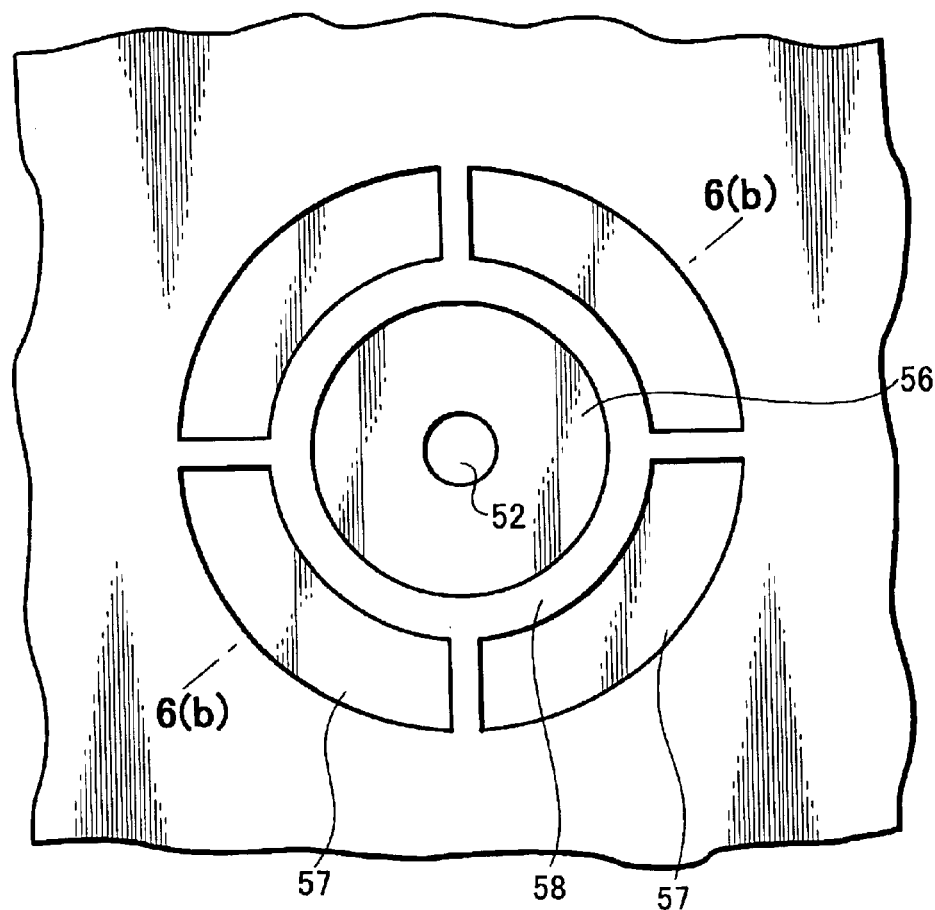
FIG. 6(a) is a plan view of a conventional composite land.
Figure 6B:
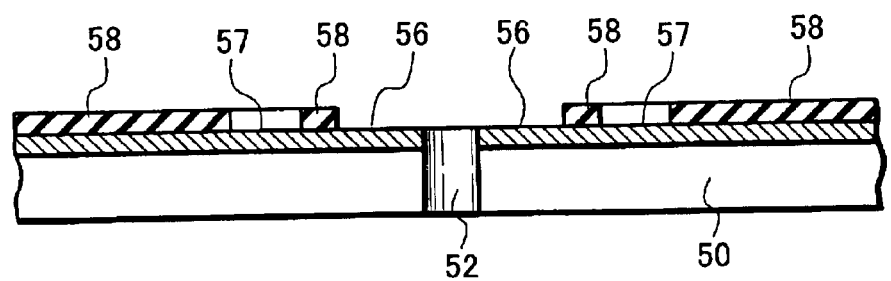
FIG. 6(b) is a sectional view of the composite land taken along the line "6(b)"—"6(b)".

Referring to FIG. 4, still another example of a composite land is composed of a first land 3 having a terminal hole 2 formed at its center, and four second radial lands 4 contiguous to the first land 3 and extending outwards therefrom. Four five-sided areas 8 each having four straight sides and one curved side are formed by removing the underlying copper foils to expose the surface of the substrate 1.

As may be understood from the above, the composite land is encircled with thermal insulating zones, which are provided by removing the copper or conductive metal layer from the selected patches, thus exposing the underlying substrate surface. This effectively prevents thermal energy from leaking outwards from the composite land contour in soldering the terminal of an electric or electronic part or device to the composite land. The resultant ridged cone-like solder lump has an increased strength to hold the terminal in the terminal hole in spite of a relatively small solder quantity used.

What is claimed is:

1. A printed circuit board comprising:
    a substrate having first and second opposite surfaces, a plurality of terminal holes being formed through said substrate from said first surface to said second surface thereof;
    an electrically conductive circuit pattern provided on said first surface of said substrate;
    wherein said electrically conductive circuit pattern comprises a plurality of composite lands, each of said composite lands including
    a first land having a center hole aligned with one of said terminal holes of said substrate so as to allow said center hole and said terminal hole to receive a terminal of an electric or electronic part or device, and a plurality of second lands each being contiguous to and extending radially outwardly from said first land;

wherein, for each of said composite lands, thermal insulating areas are formed radially outwardly of said first land and circumferentially between adjacent ones of said second lands, each of said thermal insulating areas being constituted by an area of said substrate that is devoid of a conductive layer thereon so as to inhibit thermal conduction away from said first and second lands; and wherein, for each of said composite lands, a narrow resist layer is formed so as to be arranged along a border between said composite land and each of said thermal insulating areas.

2. A soldering structure for electric or electronic parts or devices, comprising:

a substrate having first and second opposite surfaces, a plurality of terminal holes being formed through said substrate from said first surface to said second surface thereof;

a first electrically conductive circuit pattern provided on said first surface of said substrate;

a second electrically conductive circuit pattern provided on said second surface of said substrate;

terminal hole conductor layers formed on inner circumferences of said terminal holes, respectively, and electrically connecting said first electrically conductive circuit pattern with said second electrically conductive circuit pattern;

wherein each of said first and second electrically conductive circuit patterns comprises a plurality of composite lands, each of said composite lands including a first land having a center hole aligned with one of said terminal holes of said substrate so as to allow said center hole and said terminal hole to receive a terminal of one of the electric or electronic parts or devices, and a plurality of second lands each being contiguous to and extending radially outwardly from said first land;

wherein, for each of said composite lands, thermal insulating areas are formed radially outwardly of said first land and circumferentially between adjacent ones of said second lands, each of said thermal insulating areas being constituted by an area of said substrate that is devoid of a conductive layer thereon so as to inhibit thermal conduction away from said first and second lands; and wherein, for at least one of said composite lands, a solder lump is formed on said first land for securing the terminal of the respective electric or electronic part or device, said solder lump having a conical shape with said terminal hole being disposed at a center of said conical shape and with outer ribs protruding radially outwardly from said conical shape.

3. A soldering structure according to claim 2, wherein each of said outer ribs extends from a top to a bottom of said conical shape and, at said bottom, is disposed in one of said thermal insulating areas.

4. A soldering structure according to claim 2, wherein for each said solder lump, four of said outer ribs are provided and are spaced circumferentially about said conical shape.

5. A soldering structure for electric or electronic parts or devices, comprising:

a substrate having first and second opposite surfaces, a plurality of terminal holes being formed through said substrate from said first surface to said second surface thereof;

an electrically conductive circuit pattern provided on said first surface of said substrate;

wherein said electrically conductive circuit pattern comprises a plurality of composite lands, each of said composite lands including a first land having a center hole aligned with one of said terminal holes of said substrate so as to allow said center hole and said terminal hole to receive a terminal of one of the electric or electronic parts or devices, and a plurality of second lands each being contiguous to and extending radially outwardly from said first land;

wherein, for each of said composite lands, thermal insulating areas are formed radially outwardly of said first land and circumferentially between adjacent ones of said second lands, each of said thermal insulating areas being constituted by an area of said substrate that is devoid of a conductive layer thereon so as to inhibit thermal conduction away from said first and second lands; and wherein, for at least one of said composite lands, a solder lump is formed on said first land for securing the terminal of the respective electric or electronic part or device, said solder lump having a conical shape with said terminal hole being disposed at a center of said conical shape and with outer ribs protruding radially outwardly from said conical shape.

6. A soldering structure according to claim 5, wherein each of said outer ribs extends from a top to a bottom of said conical shape and, at said bottom, is disposed in one of said thermal insulating areas.

7. A soldering structure according to claim 5, wherein for each said solder lump, four of said outer ribs are provided and are spaced circumferentially about said conical shape.

* * * * *